(12) United States Patent
Mullapudi et al.

(10) Patent No.: US 7,479,210 B2
(45) Date of Patent: Jan. 20, 2009

(54) TEMPERATURE CONTROL OF PALLET IN SPUTTERING SYSTEM

(75) Inventors: Ravi Mullapudi, San Jose, CA (US); Dean Smith, Cupertino, CA (US); Edward Strepka, Brentwood, CA (US)

(73) Assignee: Tango Systems, Inc., San Jose, CA (US)

( * ) Notice: Subject to any disclaimer, the term of this patent is extended or adjusted under 35 U.S.C. 154(b) by 586 days.

(21) Appl. No.: 11/107,619

(22) Filed: Apr. 14, 2005

(65) Prior Publication Data

US 2006/0231390 A1    Oct. 19, 2006

(51) Int. Cl.
*C23C 14/35* (2006.01)
(52) U.S. Cl. .............. 204/298.09; 204/298.15; 204/298.23; 204/298.26; 204/298.28; 118/730
(58) Field of Classification Search .......... 204/298.01–298.41; 118/728, 729, 730, 716, 118/50.1, 232; 427/573
See application file for complete search history.

(56) References Cited

U.S. PATENT DOCUMENTS

| | | | | |
|---|---|---|---|---|
| 3,630,881 A | * | 12/1971 | Lester et al. | 204/298.09 |
| 3,718,572 A | * | 2/1973 | Robison et al. | 204/298.09 |
| 3,864,239 A | * | 2/1975 | Fletcher et al. | 204/298.06 |
| 4,745,297 A | * | 5/1988 | Sullivan et al. | 250/440.11 |
| 4,909,314 A | * | 3/1990 | Lamont, Jr. | 165/80.3 |
| 5,092,729 A | * | 3/1992 | Yamazaki et al. | 414/225.01 |

* cited by examiner

*Primary Examiner*—Rodney G McDonald
(74) *Attorney, Agent, or Firm*—Patent Law Group LLP; Brian D. Ogonowsky

(57) ABSTRACT

A multi-chamber processing system is described for depositing materials on multiple workpieces (wafers, display panels, or any other workpieces) at a time in a vacuum chamber. The system includes a sputtering chamber and a separate pre-clean chamber, where wafers can be transferred between the two chambers by a robotic arm without breaking a vacuum. The wafers are mounted one-by-one onto a rotating pallet in the pre-cleaning chamber and sputtering chamber. The pallet is firmly fixed to a rotatable table in the sputtering chamber. Copper tubing in the table couples RF energy to the wafers, and a liquid running through the copper tubing controls the temperature of the wafers. Multiple targets, of the same or different materials, may concurrently deposit material on the wafers as the pallet is rotating. Multiple magnets (one for each target) in the magnetron assembly in the sputtering chamber oscillate over their respective targets for uniform target erosion and uniform deposition on the wafers. An electrically insulated target backing plate between each magnet and a target has a liquid channel running through it for controlling temperature. The distance between the magnets and the targets is made very small by a thin aluminum plate fixed to the bottom segment of the target backing plate by a dip brazing process. Various shields are described to prevent cross-contamination from the targets and prevent the sputtered target material from entering gaps in the chamber and shorting out insulators.

11 Claims, 10 Drawing Sheets

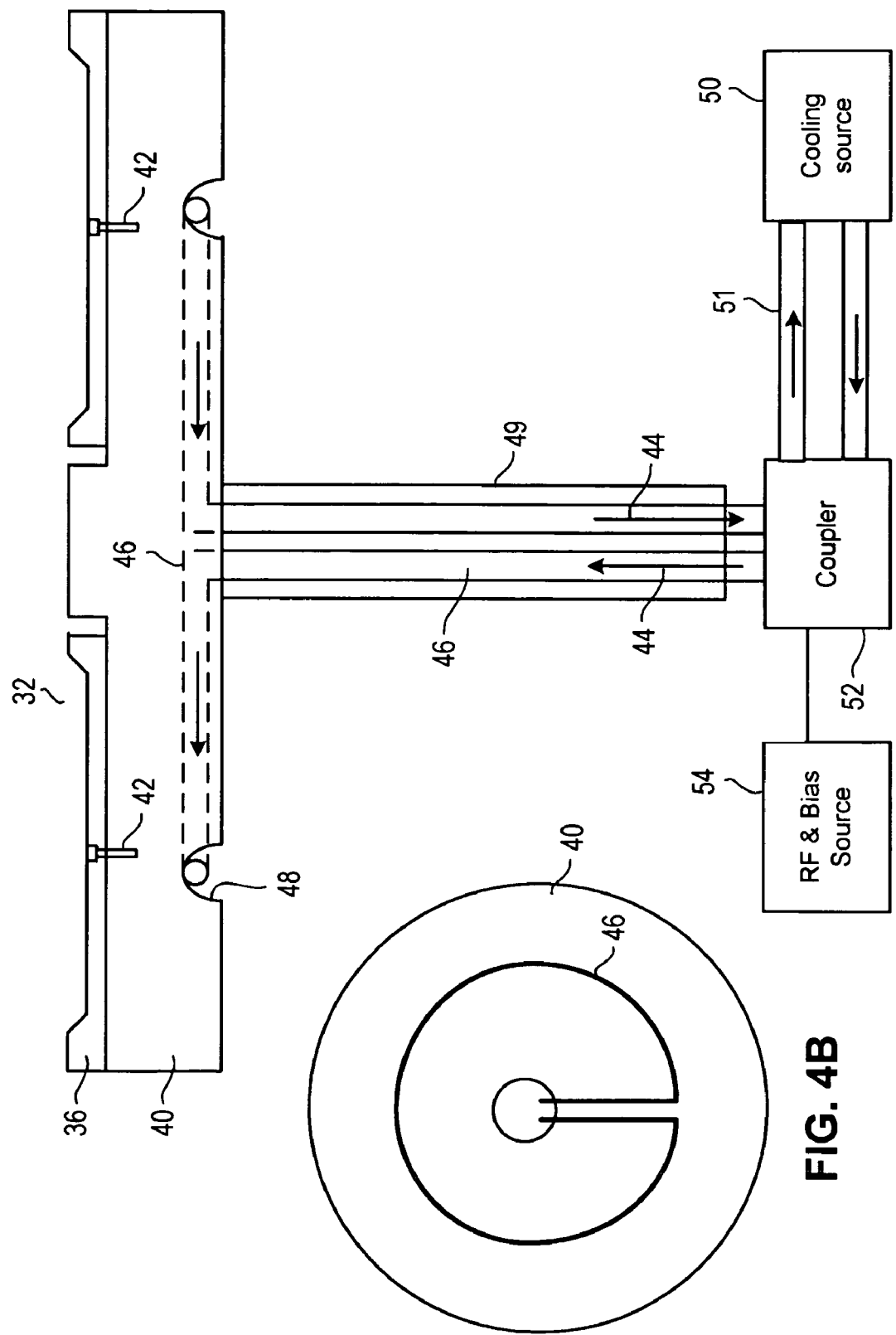

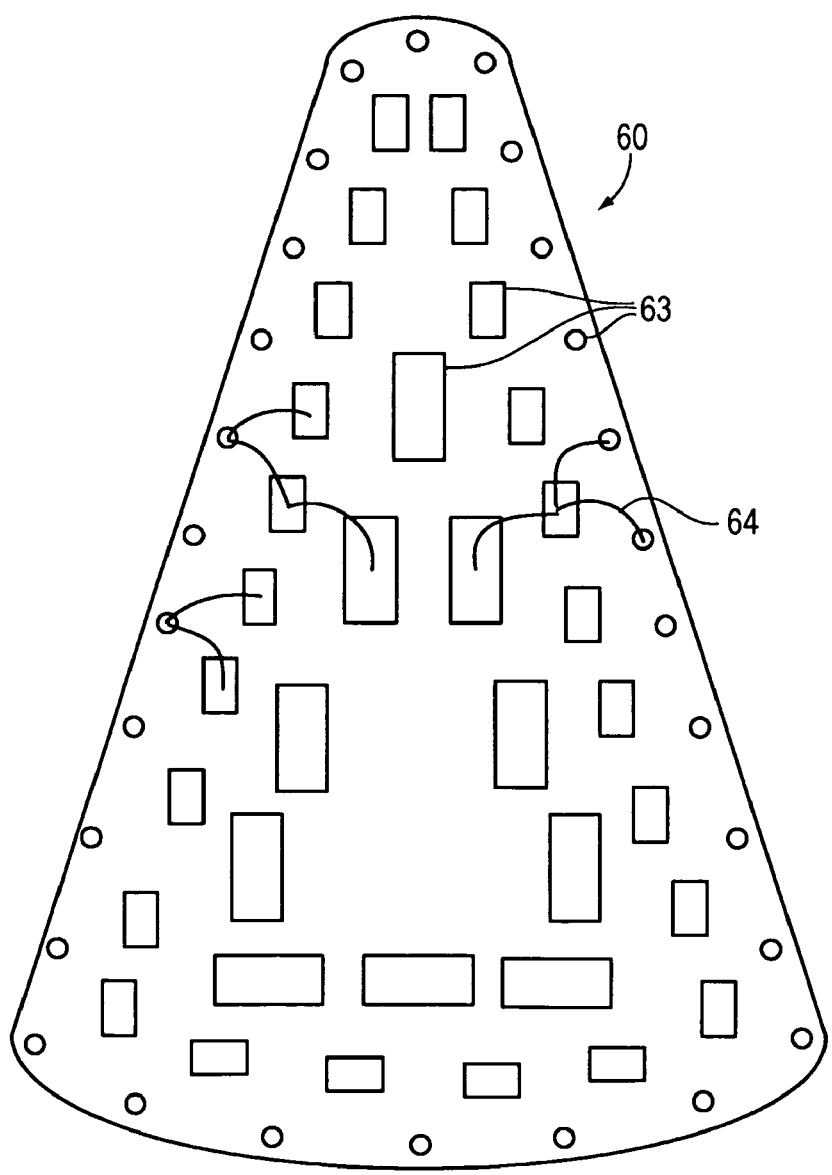
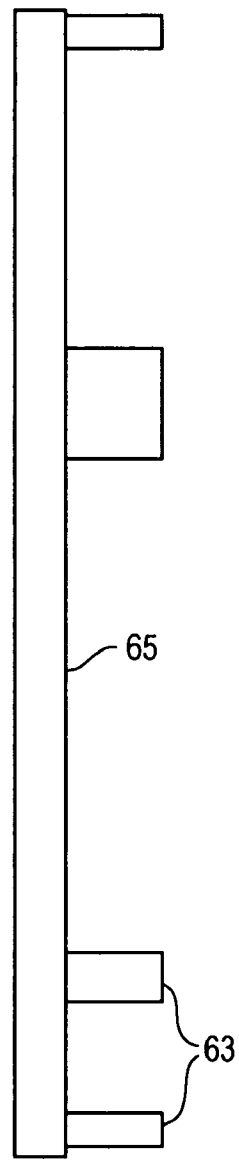
FIG. 5A     FIG. 5B

TEMPERATURE CONTROL OF PALLET IN SPUTTERING SYSTEM

FIELD OF THE INVENTION

This invention relates to deposition systems for semiconductor wafers and other workpieces and, in particular, to sputtering systems.

BACKGROUND

A sputtering system is widely used in the semiconductor manufacturing industry for depositing materials on semiconductor wafers. Sputtering is sometimes referred to as physical vapor deposition, or PVD. In a sputtering operation, thin films comprising materials such as Al, Au, Cu, Ta are deposited in a vacuum on silicon wafers or other substrates. To make a stack of thin films of different materials, one common practice is to use multiple single-wafer process chambers wherein each chamber deposits only one material on one substrate at a time. For a tri-layer structure comprising Ti/Cu/Au, three separate single-wafer process chambers are required to sequentially deposit Ti, Cu and Au onto the substrate. The dedication of an individual process chamber to specific material deposition adds equipment costs and processing costs. The limitation of single-wafer transfer between chambers slows down the system throughput.

Various other drawbacks are found in typical sputtering systems. These drawbacks relate to inefficient magnetron operation, non-uniform coverage, poor temperature control of the wafers, contamination of the wafers and other components, and non-uniform target erosion, among other things.

SUMMARY

A multi-chamber batch processing system is described for depositing materials on multiple workpieces in a vacuum chamber.

The system includes a sputtering chamber and a separate pre-clean chamber, where wafers can be transferred between the two chambers by a robotic arm without breaking a vacuum. In one embodiment, 4-6 wafers are processed at a time in each chamber.

Having a separate pre-clean chamber, such as an inductively coupled plasma (ICP) chamber, increases throughput, provides a faster etch rate, results in less contamination of the sputtering chamber, and results in less damage to the electronic circuits on the wafer. Further, since there is no need for a shutter for isolating sputtering targets during the pre-clean process, there is no added contamination from a shutter during the sputtering process.

The wafers are mounted one-by-one from a load lock to a rotating pallet in the ICP chamber. In one embodiment, the pallet is aluminum. The aluminum is anodized (or another insulator is formed) to provide an insulating film on its surface. This prevents the pallet from being etched in the ICP chamber, avoiding particulates from the pallet contaminating the wafers.

The robotic arm transfers the wafers one-by-one to the sputtering chamber from the ICP chamber without the wafers being exposed to the atmosphere, thus avoiding undesirable chemical reactions on the wafer surface, e.g: oxides.

The wafers are mounted on a direct-drive rotating pallet in the sputtering chamber. The pallet is firmly fixed to a rotatable table in the sputtering chamber to provide good thermal and electrical conductivity between the pallet and the table. Copper tubing in the table couples RF energy to the wafers, and a coolant running through the copper tubing controls the temperature of the wafers.

Multiple targets, of the same or different materials, may concurrently deposit material on the wafers as the pallet is rotating. This enables higher throughput, creates a uniform deposition, and can be used to deposit films of varying compositions on the workpieces.

Multiple magnets (one for each target) in the magnetron assembly in the sputtering chamber oscillate (0.5-10 second period) over its associated target for uniform target erosion and uniform deposition on the wafers. Each magnet is composed of many small magnets, whose arrangement and relative sizes are selected to optimize the target erosion and increase throughput.

A target backing plate between each magnets and a target has a coolant channel running through it. The distance between the magnets and the targets is made very small by a thin aluminum plate fixed to a bottom segment of the target backing plate by a dip brazing process. This small distance increases the magnetic coupling and thus density of plasma, leading to improved deposition rates and target utilization.

Various shields are described to prevent cross-contamination from the targets and prevent the sputtered target material from entering gaps in the chamber and shorting out insulators.

Other novel features of the system are described.

The system may also be used for depositing material on LCD panels (e.g., conductors for a thin film array) and other workpieces.

BRIEF DESCRIPTION OF THE DRAWINGS

FIG. 4A is a cross-sectional view of the rotating shaft, table, and pallet in the sputtering chamber.

FIG. 4B is a bottom view of the table showing a copper tube for RF coupling and coolant flow.

FIG. 5A illustrates the distribution of some magnetic flux lines in the permanent magnet used in the magnetron.

FIG. 5B is a cross-sectional view of the magnet of FIG. 5A.

Elements with the same numbers in the various figures are the same.

DETAILED DESCRIPTION

Figure 1:
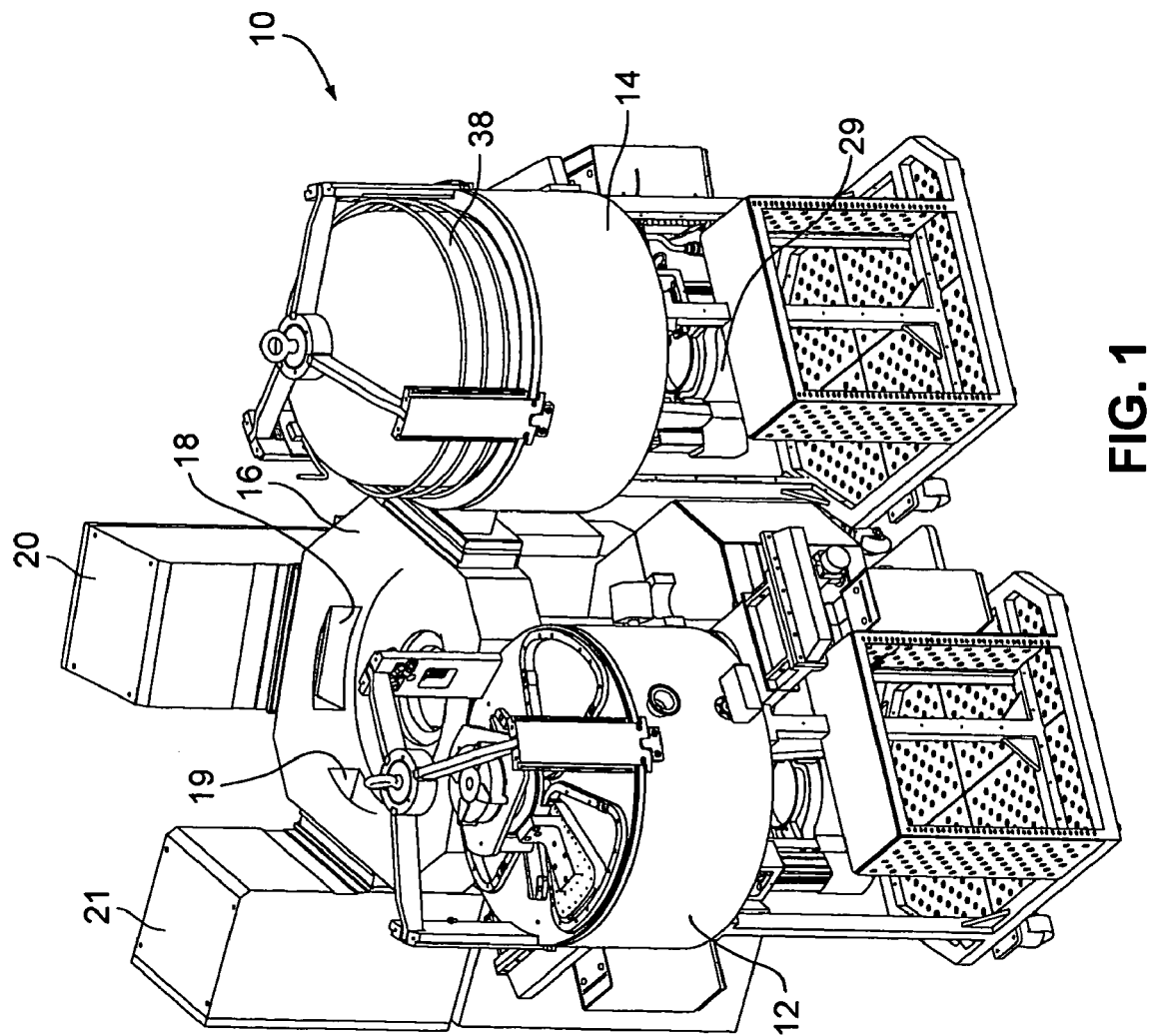
FIG. 1 is a perspective view of the multi-chamber sputtering and cleaning system with covers removed to show some internal components.

FIG. 1 illustrates a multi-chamber sputtering and pre-clean system 10 for workpieces such as semiconductor wafers, LCD panels, and other workpieces requiring the deposition of thin films. Examples of thin films include Al, Cu, Ta, Au, Ti, Ag, Sn, NiV, Cr, TaNx, Hf, Zr, W, TiW, TiNx, AlNx, AlOx, HfOx, ZrOx, TiOx, and alloys of two or more of these elements. The top covers of the sputtering chamber 12, pre-clean chamber 14, and wafer transport module 16 have been removed. The robotic arm in the wafer transport module 16 is not shown in FIG. 1 in order to see the access ports 18, 19 from load locks 20, 21.

Typical wafer sizes are 6, 8, and 12 inches, and the system is customized for the particular workpieces for processing.

Figure 2:
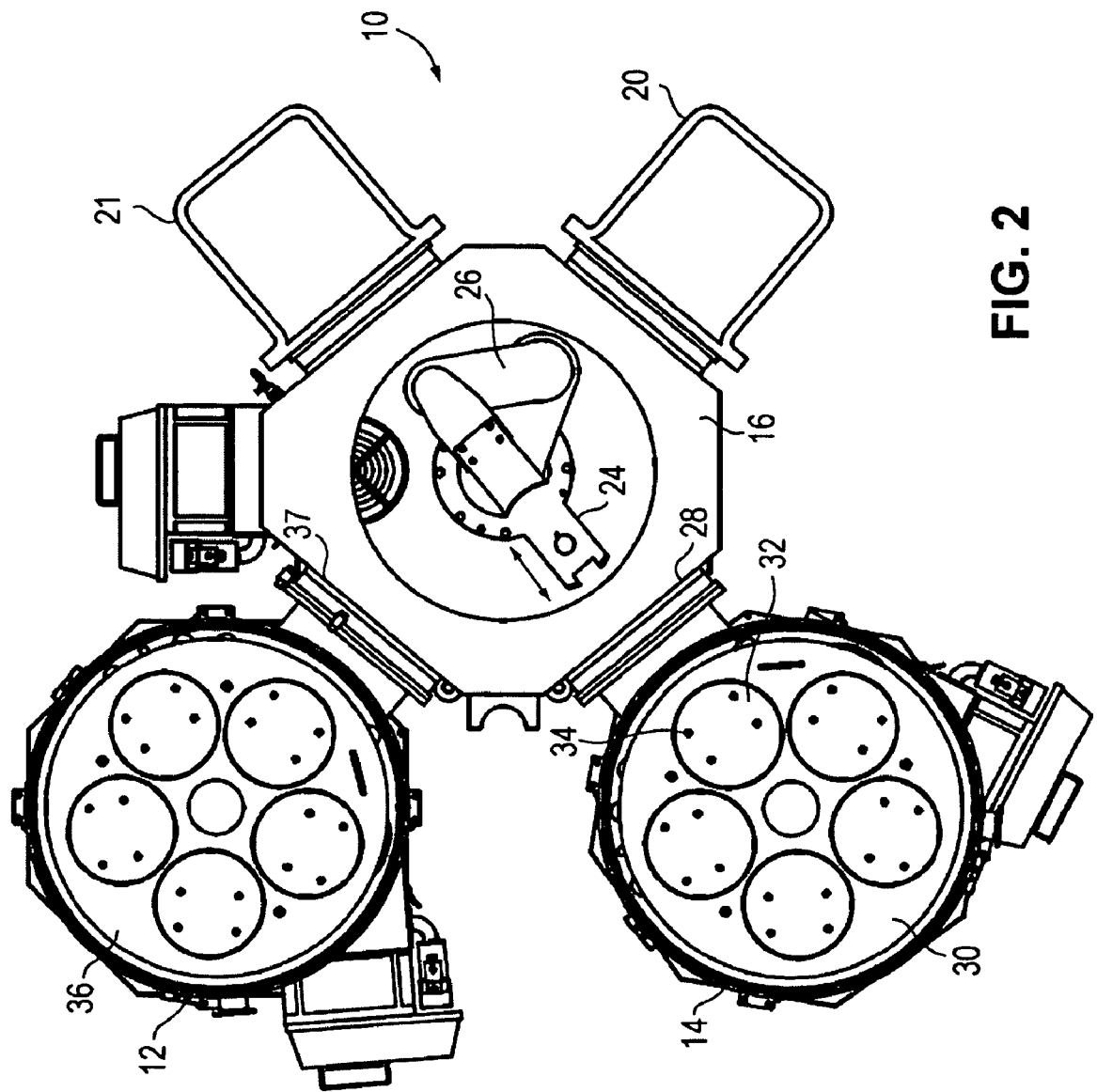
FIG. 2 is a top down view of the multi-chamber system exposing the rotating pallets and robotic arm in the transport module.

FIG. 2 is a top down view of the system 10, where the wafer-supporting pallets are revealed in chambers 12 and 14. The robotic arm 24 is shown in the transport module 16.

To load wafers into the system 10 for thin film deposition, a stack of wafers supported in a cassette is placed in load lock 20. The cassette supports each wafer by its edge. A vacuum is then created in load lock 20 and transport module 16 by a vacuum pump. The vacuum pumps used in the system can create pressures below 0.001 milli-torr.

The robot arm 24 rotates to align itself with the load lock 20, and arm 24 is inserted into load lock 20 by rotation of an arm 26. The cassette is positioned by an elevator so that the bottom wafer is slightly above arm 24. The elevator then lowers the cassette so that the wafer is supported entirely by arm 24. Arm 24 is then pulled back into the transport module 16, and arm 24 is aligned with port 28 of the pre-clean chamber 14. The pre-clean chamber 14 is isolated from the transport module 16 by a slit valve (not shown). The pressure in the pre-clean chamber 14 is brought down by a vacuum pump 29 (FIG. 1) to the same pressure (base pressure) as in the transport module 16, and the slit valve is opened. Arm 24 extends the wafer over a rotatable pallet 30 in chamber 14. Pallet 30 rotates to align a wafer support area 32 below the wafer. The wafer support area 32 is an indented area in pallet 30 sized to accommodate the particular wafers being processed. In another embodiment, electrostatic chucks (ESC) are used to support the wafer. An ESC provides added flexibility in biasing the wafer, and each ESC may be separately controlled. An ESC may also provide better thermal conductance between the wafer and the pallet 30 due to a strong clamping action on the wafer.

Four pins below pallet 30 are raised to extend through four holes 34 in the wafer support area 32 to lift the wafer off arm 24. Arm 24 is withdrawn, and the pins are lowered so that the wafer is seated in the indentation and the entire back surface of the wafer is in contact with pallet 30. This is important for temperature control and biasing, to be described later.

The robotic arm 24 then goes back to get another wafer from the cassette, and the pallet 30 rotates to align the next wafer support area 32 with the port 28. The transfer process is repeated until five wafers are placed on pallet 30. In a preferred embodiment, pallet 30 has four to six wafer support areas 32 but there may be more or fewer areas as desired.

During the process of loading the pre-clean chamber 16, arm 24 may also be removing cleaned wafers from pallet 30 and placing them on a similar pallet 36 in the sputtering chamber 12. The sputtering chamber 12 has a port 37 and slit valve similar to those of the pre-clean chamber 14. The loading process onto pallet 36 is the same as the loading described above.

Pre-cleaning of the wafers is important to remove impurities, e.g: oxides, from the wafer's surface so that metal films deposited in the sputtering chamber are not electrically insulated from the wafer. By performing pre-cleaning in chamber 14, part of a multichamber vacuum environment to which sputtering chamber 12 is connected, the wafers can be transported from the cleaning chamber 14 to the sputtering chamber 12 without being exposed to the atmosphere (or otherwise contaminated), so impurities do not form on the workpiece during the transportation time. Further, vacuum pump-down cycles are reduced since a vacuum is maintained in the multi-chamber system during transfer of the cleaned wafers to the sputtering chamber. Only when a cassette is full in load lock 21 or when a cassette is empty in load lock 20 does the system need to break the vacuum to remove or introduce wafers from and to the system.

In some sputtering systems, the pre-clean is performed in the same chamber as the sputtering (in situ). This results in a compromised design of the equipment and causes etched particles to accumulate on the chamber walls and other portions. Such particles contaminate the wafer during the sputtering process and shorten time between maintenance cycles. Further, since there is no need for a shutter for isolating sputtering targets during the pre-clean process, there is no added contamination from a shutter during the sputtering process.

In the preferred embodiment, the pre-clean chamber 14 uses inductively coupled plasma (ICP) for etching the wafer. A coil 38 (FIG. 1) at the top of chamber 14 is energized with an external RF source (e.g., at 13.56 MHz) to create an excitation field in the chamber 14. Argon gas flows through the chamber 14 from an external gas source. The argon atoms in the chamber 14 are ionized by the RF energy so are charged. The wafers are biased by a DC biasing source coupled to the aluminum pallet 30 so that the ions are attracted to the wafers and etch the wafers. Other gases may be used depending on the desired etch rate and materials to be etched. The etching is a cleaning process rather than a process to etch features in the wafer materials so the energy levels may be low. This avoids damaging circuit devices and features already formed in the wafer. ICP etching is a well known process so additional detail is not necessary for describing the chamber 14 and its operation.

The aluminum pallet 30 in the pre-clean chamber 14 is anodized to provide an electrically insulating film on its surface. This reduces the etch rate of pallet 30 when the wafers are being cleaned in the ICP chamber, avoiding particulates from the pallet contaminating the wafers. The anodized surface may be obtained by heating pallet 30 in an oxygen atmosphere, depositing a layer of aluminum oxide, or plasma spraying a layer of aluminum oxide. An insulating surface of pallet 30 may also be obtained by depositing a ceramic coating, or other insulating films. A thicker insulating film reduces the effective bias at the pallet surface and thus reduces the etching rate of the pallet. In one embodiment, the insulating film is greater than 2 mils (0.05 mm).

In another embodiment, a material may be deposited on pallet 30 that is desired to be deposited on the wafers during the pre-clean process. The plasma clean will then dislodge the material from pallet 30 and coat the wafers with the material.

Figure 3:
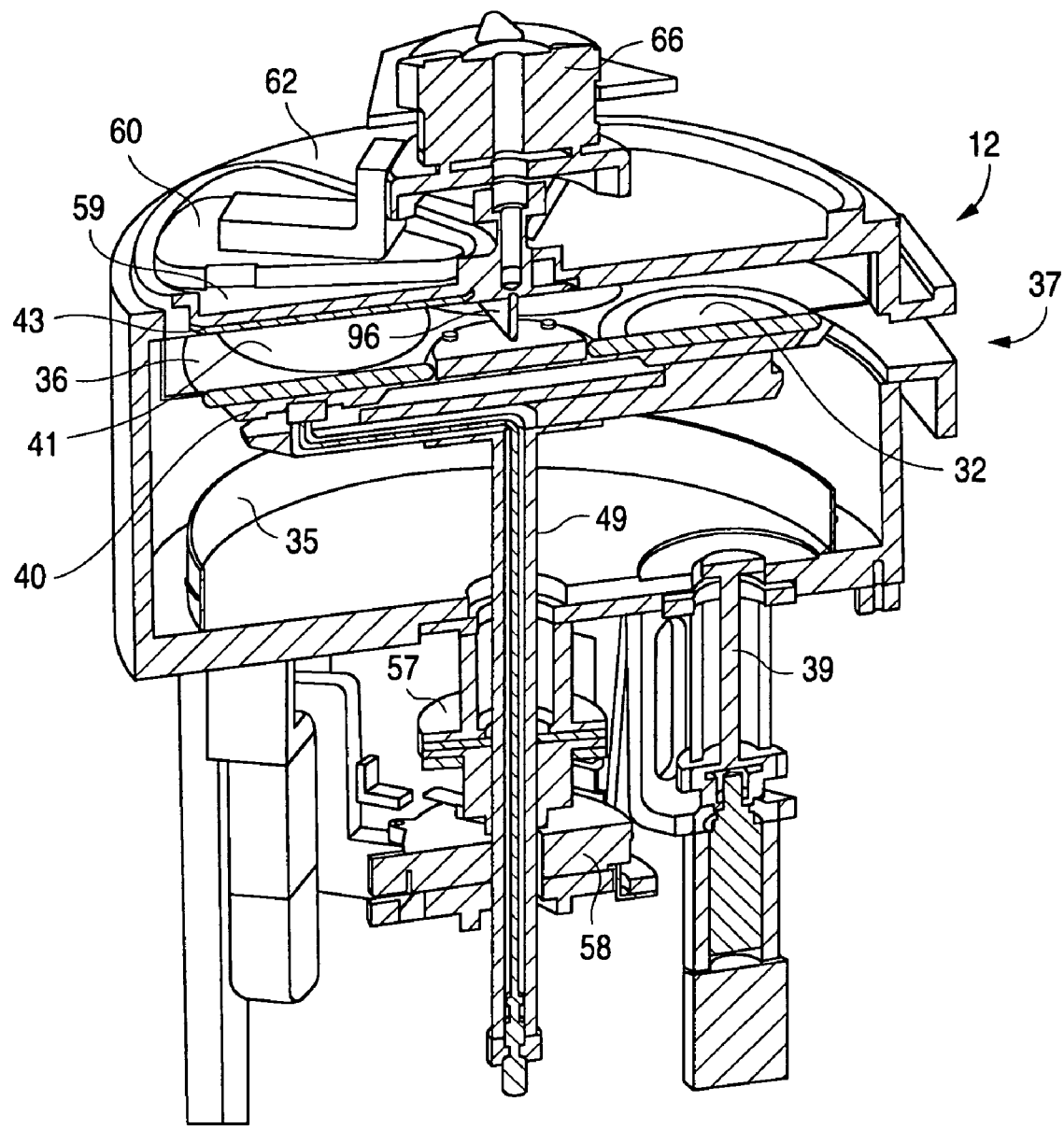
FIG. 3 is a cutaway view of the sputtering chamber.

After the pre-clean process, in which any unwanted native oxide has been etched off the wafer surface, the robot arm 24 transports the five wafers, one-by-one, into the sputtering chamber 12. FIG. 3 is a cutaway view of the sputtering chamber 12 with its cover removed. The below description of the pallet 36 and table 40 in the sputtering chamber 12 also applies to the pallet 30 and table in the pre-clean chamber.

FIG. 3 illustrates pallet 36 mounted on a rotatable table 40. Pallet 36 and table 40 may be formed of aluminum. Pallet 36 may be continuously rotated at any speed or may be temporarily stopped to control the deposition of a sputtered material from a target 43 overlying a wafer. A wafer 41 is shown in one of five wafer supporting areas 32.

Pin bellows 39 is shown in FIG. 3 for pushing up the four pins (not shown), described above, into the wafer support area 32 for transferring the wafer to and from the robotic arm 24. The pin bellows 39 may be controlled pneumatically or driven directly by a motor.

A chamber shield 35 prevents contaminants from accumulating on the chamber wall.

FIG. 4A is a cross-sectional view of pallet 36 and table 40. Pallet 36 is about ¼ to ½ inch (6.3-12.7 mm) thick, and table 40 is about 1 inch (25.4 mm) thick. Pallet 36 is a single piece that is fixed to table 40 by a countersunk screw 42 at the indentation in each wafer support area 32 so that the wafers block the sputtered materials being deposited on screws 42. Pallet 36 may be removed for cleaning by unscrewing screws 42.

The entire back surface of each wafers is thus in electrical and thermal contact with pallet 36, which is in turn in electrical and thermal contact with table 40.

Controlling the temperature of the wafers is important during the sputtering process to obtain a predicable and reliable thin film. The temperature of the wafers is controlled by flowing a coolant 44 (FIG. 4A) through a copper tube 46 in direct contact with table 40. In one embodiment, the copper tube 46 is brazed to table 40. The copper tube 46 runs in a groove 48 around the table 40, as shown in FIG. 4B, which is a bottom view of table 40.

The copper tube 46 extends up through a rotating shaft 49 attached to table 40.

An external cooling source 50 cools the coolant (e.g., water) and recycles the coolant back to table 40. Flexible tubing 51 from the cooling source 50 attaches to a rotatable coupler 52 for providing a sealed coupling between the rotating copper tubes 46 (input and output) and the stationary tubing 51 to/from the cooling source 50.

In another embodiment, the cooling source may be replaced or augmented by a heating source to increase the workpiece temperature independent of the ICP or sputtering process.

An RF and bias source 54 is electrically coupled to the copper tube 46 by the rotatable coupling 52 to energize table 40 and thus energize pallet 36 and the wafers for the sputtering process. In another embodiment, table 40 is grounded, floated, or biased with only a DC voltage source.

When the chamber 12 is evacuated and back filled with a certain amount of Ar gas at a certain pressure (for example, 20 milli-torr) and the gas is energized with a DC source, an RF source, or a combination of the two sources, an electromagnetic field is coupled inside chamber 12 to excite a sustained high density plasma near the target surface. The plasma confined near the target surface (described later) contains positive ions (such as Ar+) and free electrons. The ions in the plasma strike the target surface and sputter material off the target. The wafers receive the sputtered material to form a deposited layer on the surface of the wafers. In one instance, up to twenty kilowatts of DC power can be provided on each target. In such a case, each target can deposit approximately 1 micron per minute of copper, simultaneously, on multiple work pieces.

The chamber 12 wall is typically electrically grounded in processing operations.

A bias voltage on the wafers can drive a flux of an electrically charged species (Ar+ and/or atomic vapor sputtered off the target) to the wafers. The flux can modify the properties (for example, density) of the sputtered material to the wafers.

Generating a plasma for sputtering and the various biasing schemes are well known, and any of the known techniques may be implemented with the described sputtering system.

In a preferred embodiment, the chamber gas is provided by a distribution channel at the bottom of the chamber 12, rather than from the top, which reduces particle contamination during the sputtering process and allows optimization of the magnetron assembly (described later).

FIG. 3 illustrates a motor 58 for rotating shaft 49. Shaft 49 is directly coupled to the motor 58 so that pallet 36 is directly driven by motor 58. This greatly increases the accuracy of positioning pallet 36 over a belt drive or a gear drive. In the embodiment of FIG. 3, motor 58 surrounds shaft 49 and has a central rotating sleeve fixed to shaft 49. Motor 58 may be a servo or stepper motor. In one embodiment, the motor is a servo motor that uses an absolute encoder attached to shaft 49 to determine the angular position of shaft 49. In an absolute encoder, a disc with fine optical markings uniquely identifies the angular position without the need for counting pulses or determining a home position. For example, the disc may be glass covered with an opaque film with a number of etched concentric rings taking the form of different length transparent dashes. The set of light openings at each radial position across the rings creates a unique digital code. A motor controller, using an LED and phototransistors, senses the optical markings at each radial position and uses that information to position shaft 49 for wafer loading and unloading and to control the RPM of pallet 36 during the deposition process (typically 5-30 RPM).

A seal 57 provides a seal around shaft 49 in order to maintain a low pressure in chamber 12.

The sputtering chamber 12 uses a magnetron assembly, outside the vacuum, to further control the bombardment of the target by the plasma. In a typical system a fixed permanent magnet is located behind the target (serving as a deposition source) so that the plasma is confined to the target area. The resulting magnetic field forms a closed-loop annular path acting as an electron trap that reshapes the trajectories of the secondary electrons ejected from target into a cycloidal path, greatly increasing the probability of ionization of the sputtering gas within the confinement zone. Inert gases, specifically argon, are usually employed as the sputtering gas because they tend not to react with the target material or combine with any process gases and because they produce higher sputtering and deposition rates due to their high molecular weight. Positively charged argon ions from the plasma are accelerated toward the negatively biased target and impact the target, resulting in material being sputtered from the target surface.

FIG. 5A illustrates one of the three magnets 60 overlying a target backing plate 59 (FIG. 3), supported by a grounded top plate 62 (FIG. 3) in the sputtering system. Magnet 60 has a triangular or delta shape with rounded corners. In one embodiment, the thickness of magnet 60 is between 0.5-1¼ inch thick (12-31 mm). In the example of FIG. 5A, there are three rings (nested patterns) of individual magnets 63, where adjacent rings have opposite poles so that a magnetic field spans across one ring to the next. Some magnetic field lines 64 are shown. Since there are three rings of magnets, there are two racetracks of field lines. These magnetic fields pass through the target backing plate 59 and intersect the target 43 attached to the underside of the target backing plate 59 in FIG.

3. The plasma density at the target (and thus the erosion rate) is greatest at the highest magnetic field intensity. The sizes, shapes, and distribution of the individual magnets 63 are selected to create a uniform erosion of the target, as described below.

FIG. 5B is a cross-sectional view of one embodiment of the magnet 60. The magnets 63 are mounted to a magnetic backing plate 65, also known as a shunt plate, formed of a ferrous material. The shape and magnetic properties of the shunt plate 65 may be altered to optimize the performance of magnet 60.

The magnet 60 may also be an electromagnet.

Figure 6A:
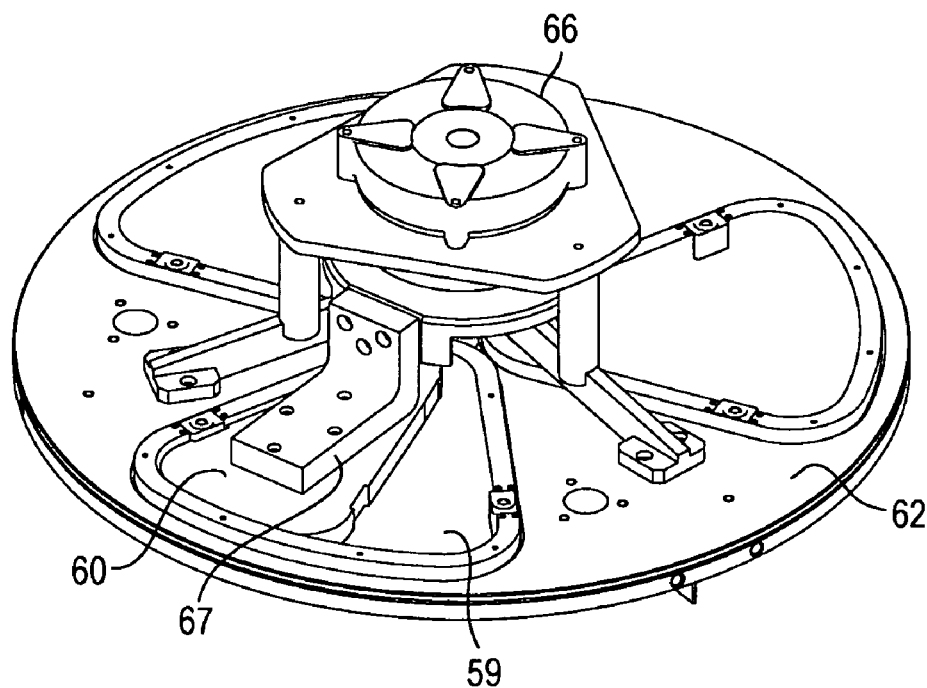
FIG. 6A is a perspective view of the magnetron assembly, forming a top portion of the sputtering chamber, with the oscillating magnet in a middle position.

FIG. 6A illustrates the magnetron portion of the sputtering chamber 12, where one magnet 60 is shown above a target (not shown). Two other identical magnets would be located above two other targets centered at 120 degree intervals. A servo motor 66 using an absolute encoder, similar to the motor 58 for the shaft 49 that rotates table 40, is controlled by a motor controller to oscillate the three magnets 60 back and forth in unison over their associated targets at an oscillating period of between 0.5-10 seconds. The magnets 60 are oscillated so that the magnetic fields are not always at the same position relative to the target. By distributing the magnetic fields evenly over the target, target erosion is uniform.

If the oscillation is too slow, then there may be time for particles of one material to accumulate on portions of a target of a different material in areas not subjected to the magnetic fields for a prolonged period. When the magnet eventually scans over that portion of the target, the sputtered material will undesirably constitute the mixed materials (varying the stochiometry of the sputtered material). The 0.5-10 second period is adequate for stochiometrically sensitive reactive films sputtered onto the workpiece. The oscillation period may be slower for non-stochiometrically sensitive reactive films sputtered onto the workpiece.

An insulating bracket 67 secures each magnet 60 to motor 66 so that there is a minimum gap between the oscillating magnet 60 and the target backing plate 59.

Since there is no field in the middle portion of magnet 60, the magnet 60 must scan a distance of at least half its width (and preferably almost its entire width) so that the middle portion of the target experiences the same magnetic fields as other portions of the target.

The individual magnets 63 along the edge of magnet 60 are smaller that the inner magnets so that the magnetic field extends close to the edge of magnet. The span of a magnetic field can be approximated by the distance between the centers of the two opposite poles. Hence, the diameters of the outer magnets 63 are made small (e.g., 0.5-1 cm). The inner rings of magnets 63 may be larger. In the example, the inner magnets 63 are rectangular to shorten the distance between the inner magnets and the outer magnets.

The size of magnets 60 depends on the size of the wafers, which determines the size of the targets. In one embodiment, a magnet 60 is about 10.7 inches (27 cm) long and about 3 inches (7.6 cm) wide at it widest part. An eight inch wafer may use a target that is from 10-13 inches long in the radial direction. A twelve inch wafer may use a target that is from 13-18 inches long in the radial direction. These target and magnet length dimensions are very small compared to the prior art. These small dimensions mean more efficient chamber volume, thus a smaller footprint; and also smaller and more efficient targets, resulting in lower costs for the targets and system. Generally, the target and magnet length perpendicular to the scanning direction is between 1.1 and 1.5 times the smallest dimension of the workpiece surface facing the target.

Figure 6B:
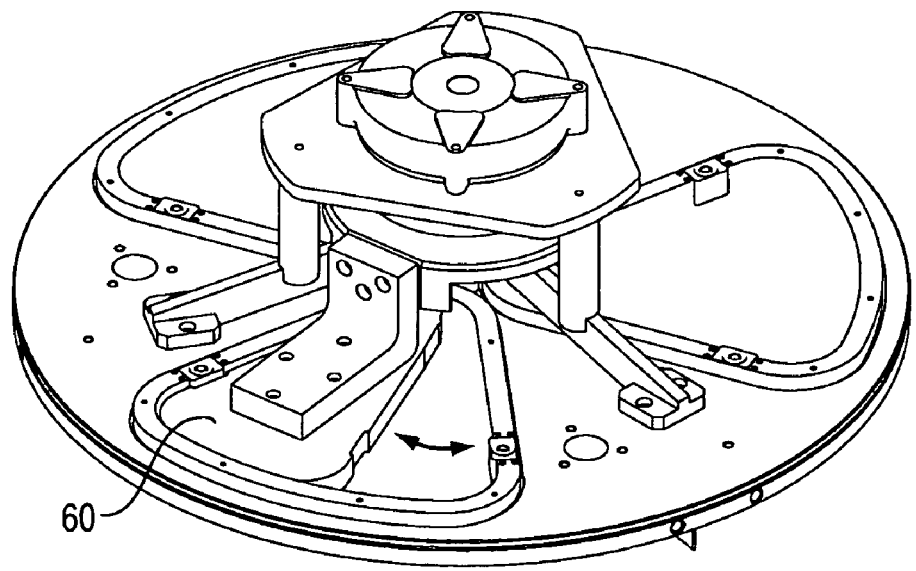
FIG. 6B is a perspective view of the magnetron assembly with one oscillating magnet at its leftmost position.

FIG. 6A illustrates magnet 60 at a middle position during an oscillation, while FIG. 6B illustrates magnet 60 at a leftmost position during the oscillation.

To maximize the magnetic fields around the target, the distance between a magnet 60 and a target should be minimized. Further, the target backing plate 59, with magnet 60 on one side and a target on the other side, needs to be cooled due to the hot plasma in the chamber 12.

Figure 7:
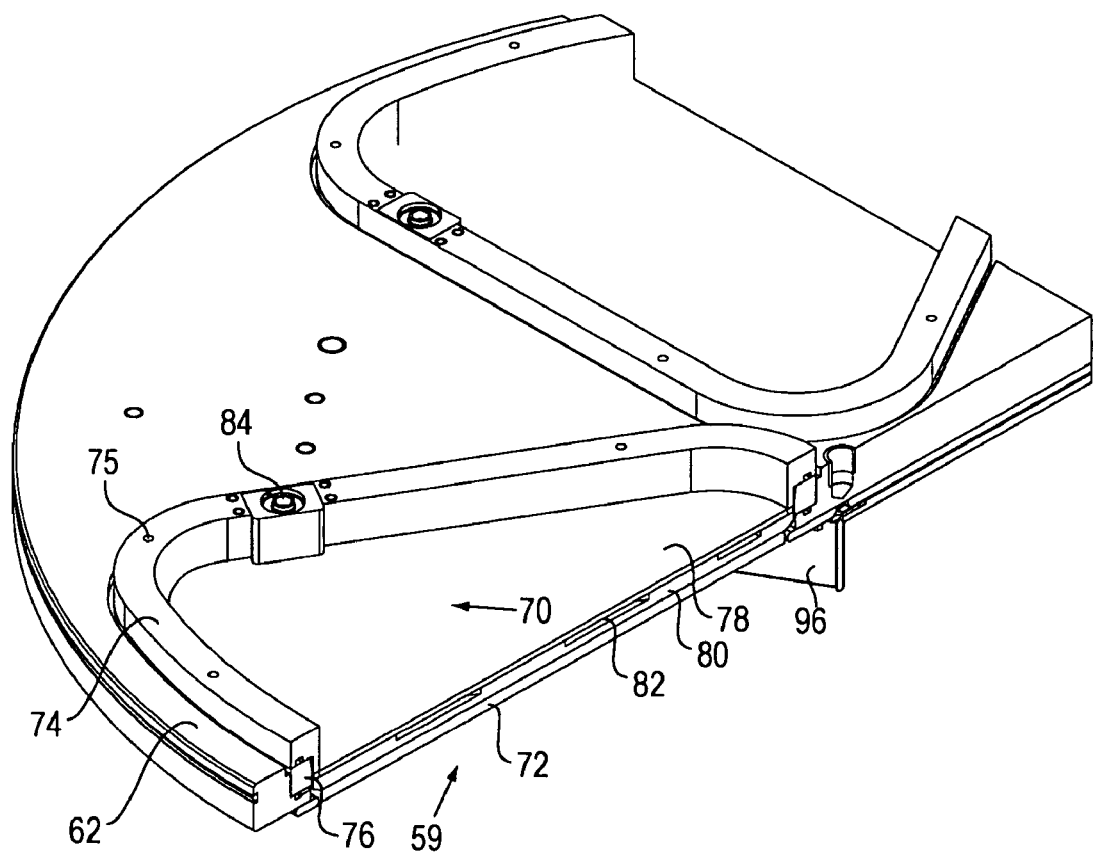
FIG. 7 is a perspective cross-sectional view of a portion of the top plate and target backing plate (for supporting the target and magnets) of the sputtering chamber.

FIG. 7 is a perspective cross-sectional view of the top plate 62 and target backing plate 59, both formed of aluminum. The thickness of the top plate 62 is about 1⅜ inch (35 mm). The magnet 60 oscillates in the recessed area 70 of the target backing plate 59. The target 72 is approximately the shape of the recessed area 70 and is secured to the target backing plate 59 by solder, a braze, a conductive epoxy, copper diffusion, or other known technique.

The target backing plate 59 (comprising the recessed area 70 and the raised area 74 around the recessed area 70) and the target 72 are electrically connected to a negative bias voltage source in order for the plasma to be concentrated in the area of the target 72. A wire (not shown) carrying a negative bias voltage is connected by a screw to the raised area 74 using one of the screw holes 75. Target 72 is also referred to as the cathode, since it is negatively biased. The top plate 62 supporting the target backing plate 59 is electrically grounded. An insulator ring 76 (e.g., a synthetic rubber ring, or other elastic material) electrically insulates the target backing plate 59 from the grounded portion. The ring 76 also mechanically supports the target backing plate 59. It is important to prevent conductive sputtered particles from contacting ring 76 to prevent a short between the target backing plate 59 and the grounded portion.

The thickness of the recessed area 70 (the distance between magnet 60 and target 72) should be thin to maximize the magnetic coupling to the target 72. In one embodiment, the thickness is between 0.5-0.75 inch (12.7-19 mm). The top of the recessed area 70 is a thin aluminum plate 78 (e.g., 0.7-3 mm) that is dip brazed to the bottom segment 80 of the recessed area 70. Between the plate 78 and bottom segment 80 is a coolant (e.g., water) channel 82, shown in FIG. 8. A heated liquid may also be run through channel 82.

Figure 8:
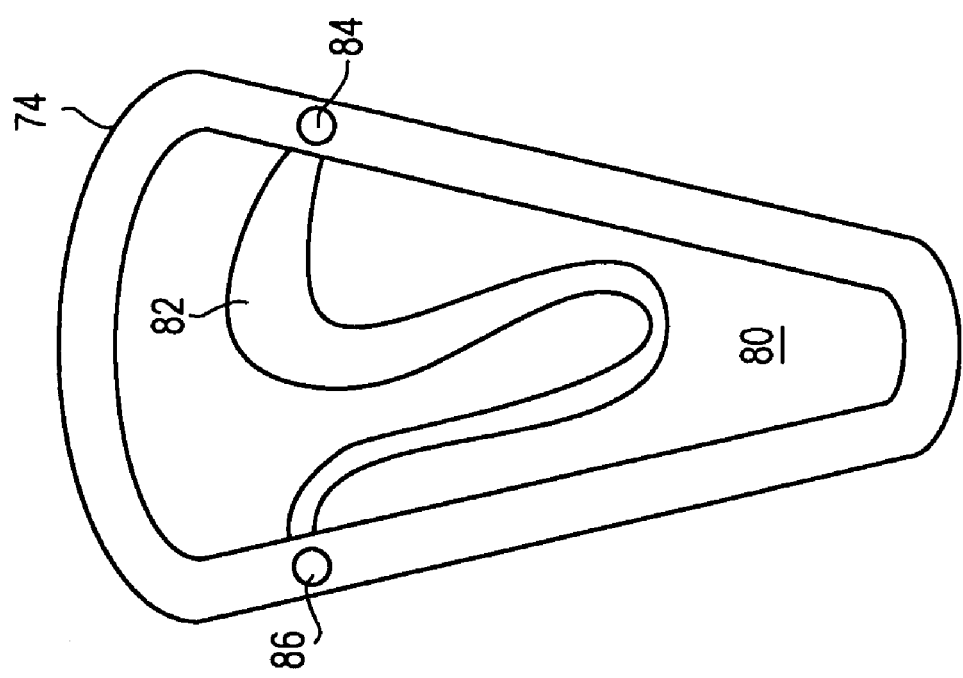
FIG. 8 is a top down view of the target backing plate without its thin cover, showing a coolant channel.

FIG. 8 illustrates a simplified channel 82 formed in the bottom segment 80 between a coolant input port 84 (also see FIG. 7) and a coolant output port 86. Flexible tubing (not shown) connects each port 84/86 for each magnet to an external coolant source so that each recessed area 70 is independently cooled by a coolant flowing through the channel 82. As shown in FIG. 8, the channel 82 is in a serpentine pattern and in a shape such that the area of the channel 82 varies based on the amount of cooling needed to maintain the same temperature over the entire recessed area 70. In one embodiment, the thickness of the coolant channel 82 is 1-3 mm. The coolant enters at the wide portion of the target backing plate 59 where the temperature is normally the hottest.

Figure 9:
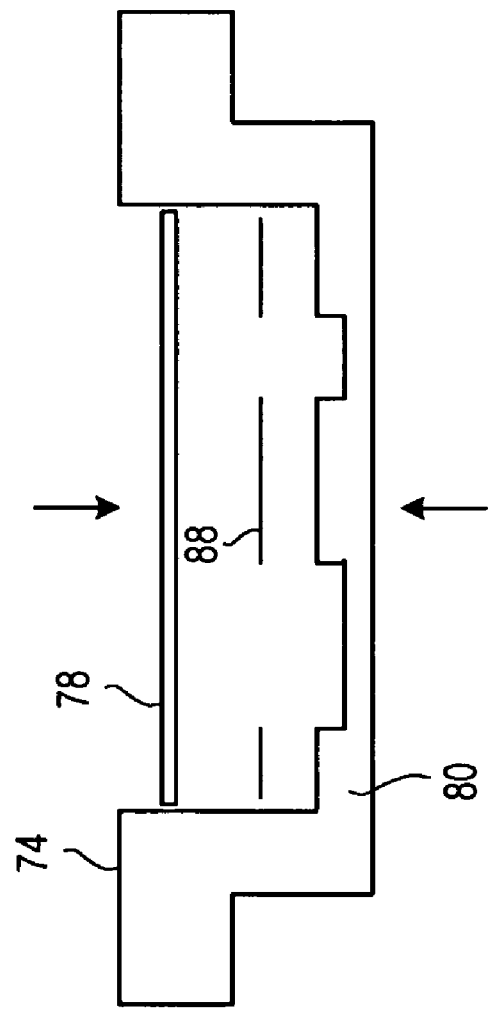
FIG. 9 is an exploded cross-sectional view illustrating a dip brazing process for forming the target backing plate between the magnet and the target.

The plate 78 that forms the top surface of the recessed area is dip brazed to the bottom segment 80 as follows. As shown in FIG. 9, a thin aluminum alloy foil 88 (a eutectic material) having the general shape of the bottom segment 80 is interposed between the bottom segment 80 and the thin plate 78. The eutectic foil 88 has a melting point lower than the melting temperature of the aluminum used to form the bottom segment 80 and thin plate 78. Various eutectic aluminum alloys can be used. A clamp presses the thin plate 78 and the bottom segment 80 together, and the structure is placed in a molten salt bath at a temperature sufficient to melt the eutectic foil 88 but not hot enough to melt pure aluminum. The melting of the eutectic sheet 88 brazes the thin plate 78 to the bottom segment 80.

In one embodiment, the aluminum used for the bottom segment 80 and the thin plate 78 is designated as 6061 aluminum in the trade and has a melting temperature of 1110 degrees F. (598 degrees C.). The material used for the eutectic foil 88 is designated as 4047 aluminum in the trade and has a melting temperature of 1065 degrees F. (574 degrees C.). The composition of 4047 aluminum is: Si 11.0-13.0%; Cu 0.3%; Mg 0.1%; Fe 0.8%; Zn 0.2%; Mn 0.15%; Al remainder.

Figure 10:
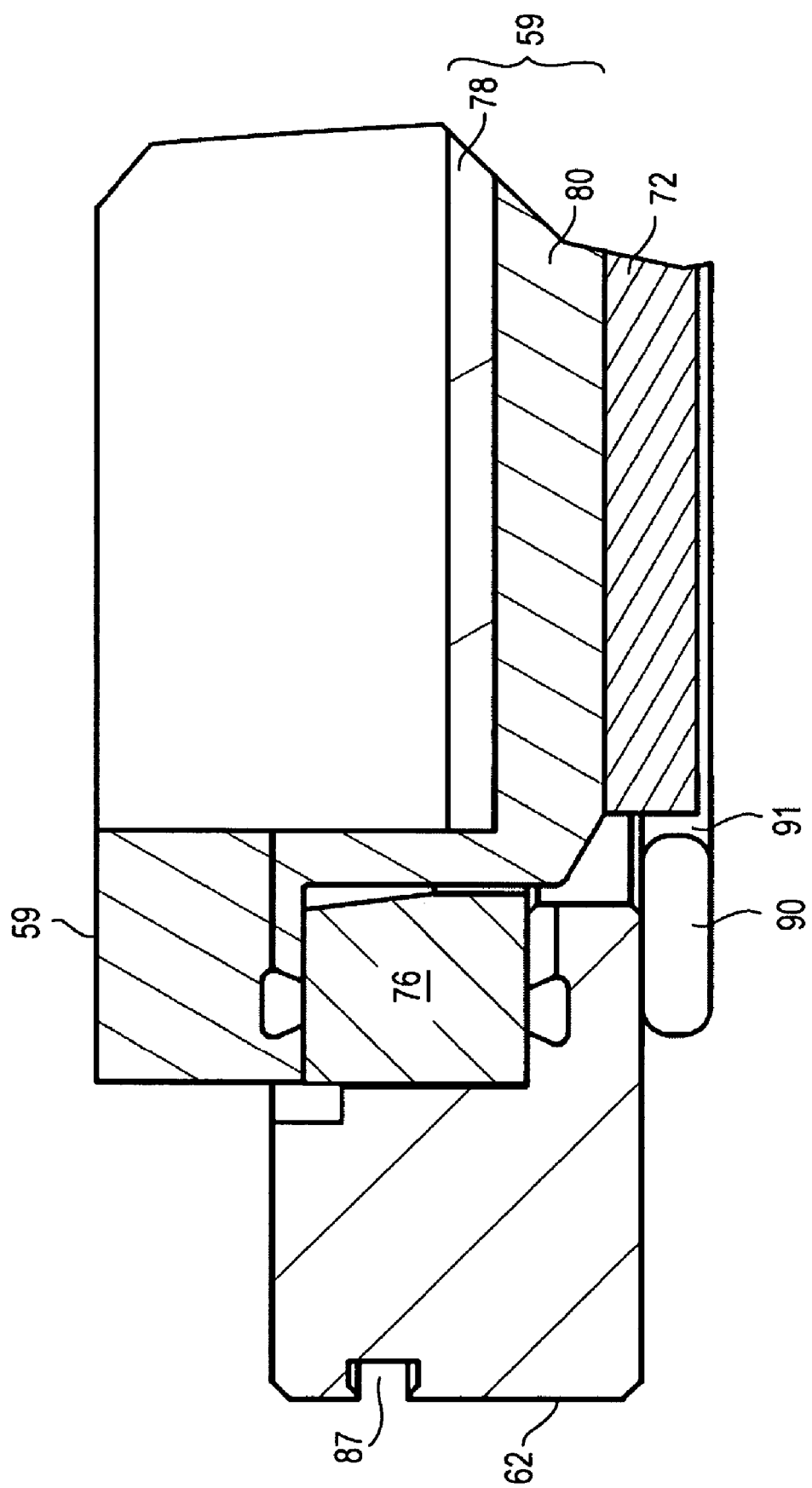
FIG. 10 is a cross-sectional view of the top plate and target backing plate with a mounted target.

FIG. 10 is a cross-sectional view of a portion of the grounded top plate 62, insulator ring 76, target backing plate 59 (comprising the thin plate 78 dip brazed to the bottom segment 80), and target 72. A groove 87 for a gas seal gasket is formed in the top plate 62. The magnet 60 and coolant channels 82 are not shown.

The target 72, since at a negative bias, must not contact the grounded top plate 62. Therefore, there must be a gap between the target 72 and the top plate 62. If this gap is small enough, it creates a dark space where there is not enough space to create a plasma. Sputtered particles from target 72 entering the dark space will accumulate on the insulator 76 and eventually short the target backing plate 59 to the top plate 62. Given the manufacturing tolerances in the sizes of the top plate 62 and the target 72, as well as the mounting of the target 72, it is very difficult to ensure that the gap between the target 72 and the top plate 62 will be a minimum. To close up the dark space and prevent contamination of the insulator 76, a thin top shield 90 is fixed to the top plate 62 by countersunk screws. FIG. 10 shows the resulting narrow gap 91.

Figure 11:
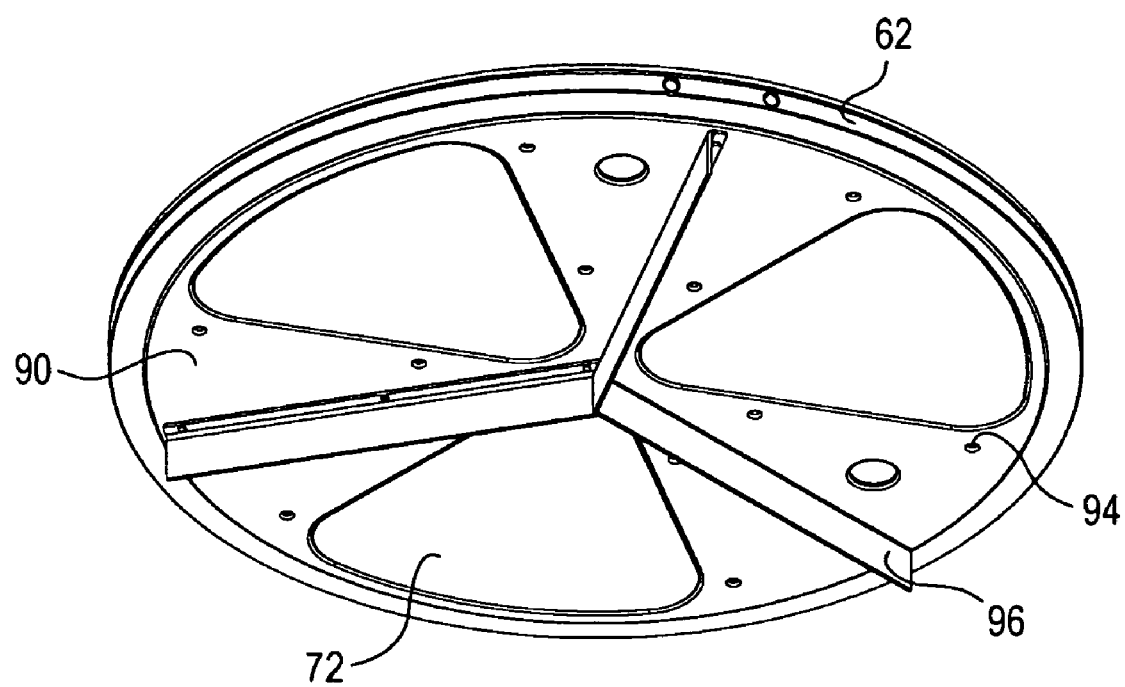
FIG. 11 is a perspective view of the underside of the top plate showing the targets and cross-contamination shields.

FIG. 11 is a perspective view of the underside of the top plate 62 and targets 72, showing the top shield 90. Since the top shield is thin aluminum or stainless steel and easily stamped to a precise tolerance, the gap between the target 72 and the top plate 62 is easily set to be a minimum (e.g., 1-2 mm). The thickness of the top shield 90 is in the range of 3/16-1/4 inch (4.7-6.3 mm). The diameter of the top plate 62 is about 28 inches (71 cm). In prior art systems, a separate anode ring for the dark spaces was installed and aligned after the gap between the target and top plate was first determined.

The top shield 90 also overlies all otherwise-exposed portions of the top plate 62 to prevent the top plate 62 from accumulating sputtered material. (The exposed edge of the top plate 62 in FIG. 11 rests on top of the chamber wall (shown in FIG. 3) so is not exposed in the chamber.) When cleaning of the chamber 12 is necessary, the top shield 90 is easily removed from the top plate 62 (by screws 94 in FIG. 11) and cleaned or disposed of. Typically, the top shield 90 will be cleaned up to ten times and then thrown away. This avoids the much more complex job of removing the top plate 62 for cleaning. Accordingly, a single, inexpensive top shield is used for both creating the dark spaces and protecting the top plate 62.

FIG. 11 also shows cross-contamination shields 96 between each target 72 position for preventing sputtered material from one target from being deposited on a wafer that is not directly under the target as the pallet 36 (FIG. 3) rotates. FIG. 3 shows a portion of a cross-contamination shield 96. The vertical walls of cross-contamination shields 96 should be less than 10 mm, and preferably less than 3 mm, from the top of the wafers (or other workpieces). The height of the cross-contamination shields 96 depends on the height of the top plate 62 above the wafers, but will normally be about 1-6 inches (2.5-15 cm).

The described sputtering system allows for all three targets to concurrently sputter the same or different materials on the wafers during a batch process. This increases throughput and allows the sputtering of alloys or layers on the wafers without breaking a vacuum. To select an alloy composition, one target may be one material, and the other two targets may be a second or third material. For depositing stacked layers of distinct materials, then only one material may be deposited at a time (e.g, one target energized at a time or multiple targets of the same material energized at a time). For depositing mixed layers (e.g. alloys of distinct materials), then all targets may be energized at the same time, assuming the targets are of different materials. More targets and wafers than shown in the examples may be employed in the system. For example, there may be eight targets. The number of such targets is limited only by the ability to build increasingly narrow magnets, which deliver a suitable magnetic flux on the target surface.

The tables/pallets on which the wafers are placed may be equipped with heaters to heat the wafers if desired. Heating may be created by resistive heaters mounted to the table or flowing a heated fluid through the copper tubing 46 (FIG. 4A). Such heaters are well known. Resistive heaters are described in U.S. Pat. No. 6,630,201, incorporated by reference.

The system sputters approximately 240 Å of Al for an input energy of 1 kW-minute. In contrast, a typical prior art system, all other conditions being equal, deposits approximately 90 Å of Al for an input energy of 1 kW-minute.

Conventional aspects of the system that have not been described in detail would be well known to those skilled in the art. U.S. Pat. No. 6,630,201 and U.S. Patent Application Publication 2002/0160125 A1 are incorporated herein by reference for certain conventional aspects primarily related to creating a plasma and supplying gas to a process chamber.

Although the system has been described with respect to forming a metal film on semiconductor wafers, the system may deposit any material, including dielectrics, and may process any workpiece such as LCD panels and other flat panel displays. In one embodiment, the system is used to deposit materials on multiple thin film transistor arrays for LCD panels.

Having described the invention in detail, those skilled in the art will appreciate that, given the present disclosure, modifications may be made to the invention without departing from the spirit and inventive concepts described herein. Therefore, it is not intended that the scope of the invention be limited to the specific embodiments illustrated and described.

What is claimed is:

1. A sputtering system comprising:
   a sub-atmospheric pressure chamber;
   a pallet in the chamber, the pallet having a plurality of workpiece support areas for concurrently supporting a plurality of workpieces on the pallet;
   a target support surface for supporting a plurality of targets having sputtering surfaces facing the pallet;
   a rotating table supporting the pallet, the pallet having a bottom surface in thermal and electrical contact with the table;
   a conduit in thermal contact with the table to control a temperature of the workpieces supported on the pallet, the conduit for having a temperature controlling liquid flowing through it; and
   a motor for rotating the pallet such that workpieces oppose different target sputtering surfaces at different times during sputtering operations,
   wherein the conduit comprises a thermally conductive pipe that contacts the table, the pipe rotating with the table,
   wherein the pallet is secured to the table with screws,
      wherein screw holes for the screws are located in the workpiece support areas so that sputtered material will be blocked by the workpieces and not be deposited on the screws.

2. The system of claim 1 wherein the pipe is electrically conductive and in electrical contact with the table.

3. The system of claim 1 further comprising a voltage source for coupling a voltage to the pipe so as to couple the voltage to the pallet.

4. The system of claim 3 wherein the voltage is DC.

5. The system of claim 3 wherein the voltage is at a radio frequency.

6. The system of claim 1 wherein the pallet is secured to the table with screws.

7. The system of claim 1 wherein the workpiece support areas comprise electrostatic chucks.

8. The system of claim 1 further comprising a heated liquid flowing through the conduit.

9. The system of claim 1 further comprising a cooled liquid flowing through the conduit.

10. The system of claim 1 wherein the motor rotates the pallet while sputtering is being performed.

11. The system of claim 1 wherein the motor stops rotating the pallet while sputtering is being performed.

\* \* \* \* \*